US010062806B2

(12) United States Patent
Fujita et al.

(10) Patent No.: US 10,062,806 B2
(45) Date of Patent: *Aug. 28, 2018

(54) METHOD OF PRODUCING III NITRIDE SEMICONDUCTOR LIGHT-EMITTING DEVICE AND III NITRIDE SEMICONDUCTOR LIGHT-EMITTING DEVICE

(71) Applicant: DOWA Electronics Materials Co., Ltd., Chiyoda-ku, Tokyo (JP)

(72) Inventors: Takehiko Fujita, Gotenba (JP); Yasuhiro Watanabe, Akita (JP)

(73) Assignee: DOWA Electronics Materials Co., Ltd., Chiyoda-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/533,138

(22) PCT Filed: Dec. 7, 2015

(86) PCT No.: PCT/JP2015/006065
§ 371 (c)(1),
(2) Date: Jun. 5, 2017

(87) PCT Pub. No.: WO2016/092804
PCT Pub. Date: Jun. 16, 2016

(65) Prior Publication Data
US 2017/0338378 A1    Nov. 23, 2017

(30) Foreign Application Priority Data
Dec. 8, 2014   (JP) .................. 2014-248293

(51) Int. Cl.
*H01L 33/14*   (2010.01)
*H01L 33/06*   (2010.01)
(Continued)

(52) U.S. Cl.
CPC .......... *H01L 33/145* (2013.01); *H01L 33/007* (2013.01); *H01L 33/06* (2013.01); *H01L 33/32* (2013.01)

(58) Field of Classification Search
None
See application file for complete search history.

(56) References Cited

U.S. PATENT DOCUMENTS

2006/0220044 A1*  10/2006  Sugawara ......... H01L 21/02389
                                                                257/96
2014/0103289 A1    4/2014  Liao et al.
2016/0211411 A1*   7/2016  Liao ................... H01L 21/0237

FOREIGN PATENT DOCUMENTS

JP    H11220166 A    8/1999
JP    2006313890 A   11/2006
(Continued)

OTHER PUBLICATIONS

Jun. 13, 2017, International Preliminary Report on Patentability issued in the International Patent Application No. PCT/JP2015/006065.

(Continued)

*Primary Examiner* — Asok K Sarkar
(74) *Attorney, Agent, or Firm* — Kenja IP Law PC

(57) ABSTRACT

We propose a method of producing a III nitride semiconductor light-emitting device including a p-type semiconductor layer, in which the p-type semiconductor layer is formed by the steps comprising: an electron blocking layer formation step for forming an electron blocking layer made of $Al_yGa_{1-y}N$ ($b<y\leq1$) on a light emitting layer; and a p-type contact formation step for forming a p-type contact layer which is $Al_xGa_{1-x}N$ ($0\leq x\leq 0.1$), directly on the electron blocking layer, and in which the electron blocking layer formation step is performed using a carrier gas containing hydrogen as a main component, and the p-type contact (Continued)

formation step is performed using a carrier gas containing nitrogen as a main component.

3 Claims, 2 Drawing Sheets

(51) Int. Cl.
    *H01L 33/32*     (2010.01)
    *H01L 33/00*     (2010.01)

(56) References Cited

FOREIGN PATENT DOCUMENTS

| | | |
|---|---|---|
| JP | 2010205767 A | 9/2010 |
| WO | 2014123092 A1 | 8/2014 |

OTHER PUBLICATIONS

Feb. 2, 2016, International Search Report issued in the International Patent Application No. PCT/JP2015/006065.

Jan. 26, 2016, Notification of Reasons for Refusal issued by the Japan Patent Office in the corresponding Japanese Patent Application No. 2014-248293.

Jun. 5, 2018. Office Action issued by the State Intellectual Property Office in the corresponding Chinese Patent Application No. 201580066931.4.

* cited by examiner

METHOD OF PRODUCING III NITRIDE SEMICONDUCTOR LIGHT-EMITTING DEVICE AND III NITRIDE SEMICONDUCTOR LIGHT-EMITTING DEVICE

TECHNICAL FIELD

This disclosure relates to a method of producing a III nitride semiconductor light-emitting device and a III nitride semiconductor light-emitting device. This disclosure relates in particular to a method of producing a III nitride semiconductor light-emitting device with high light output power and long lifetime, and an obtainable III nitride semiconductor light-emitting device by the method.

BACKGROUND

III nitride semiconductors formed from compounds in which N is combined with Al, Ga, In, and the like have conventionally been used as materials for ultraviolet light-emitting devices. In particular, III nitride semiconductors made of AlGaN having high Al content are used for ultraviolet light-emitting devices and deep ultraviolet light-emitting devices (DUV-LED) having a light emission wavelength of 300 nm or less.

Examples of the characteristics required of a light-emitting device include high external quantum efficiency properties and low resistance properties. JP 2010-205767 A (PTL 1) describes that a layer serving as an energy barrier for electrons that is called an electron blocking layer is formed between a light emitting layer having a quantum well structure and a p-cladding layer, thereby increasing the light emission efficiency.

CITATION LIST

Patent Literature

PTL 1: JP 2010-205767 A

SUMMARY

Technical Problem

A light-emitting device manufactured by the method of PTL 1 has excellent light output power, but leaves room for improvement in its lifetime. In view of the above, it could be helpful to propose a method of producing a III nitride semiconductor light-emitting device having high light output power and long lifetime, and an obtainable III nitride semiconductor light-emitting device by the method.

Solution to Problem

The inventors of the this disclosure made various studies on ways to solve the above problems. As a result, for a p-type semiconductor layer 50 of a III nitride semiconductor light-emitting device 100 illustrated in FIG. 1, they found it significantly effective to provide a p-type contact layer on an electron blocking layer 51 without providing a p-type cladding layer 52 on the electron blocking layer 51; form the electron blocking layer 51 using a carrier gas containing hydrogen as a main component; and form the p-type contact layer using a carrier gas containing nitrogen as a main component.

Specifically, we propose the following features.

(1) A method of producing a III nitride semiconductor light-emitting device including an n-type semiconductor layer, a light emitting layer having a quantum well structure in which a well layer is formed from $Al_aGa_{1-a}N$, where a satisfies $0.3 \le a \le 0.8$, and a barrier layer is formed from $Al_bGa_{1-b}N$, where b satisfies $0.4 \le b \le 0.95$, and a p-type semiconductor layer in this order, wherein the p-type semiconductor layer is formed by the steps comprising: an electron blocking layer formation step for forming an electron blocking layer made of $Al_yGa_{1-y}N$, where y satisfies $b < y \le 1$, on the light emitting layer; and a p-type contact formation step for forming a p-type contact layer which is $Al_xGa_{1-x}N$, where x satisfies $0 \le x \le 0.1$, directly on the electron blocking layer. The electron blocking layer formation step is performed using a carrier gas containing hydrogen as a main component, and the p-type contact formation step is performed using a carrier gas containing nitrogen as a main component.

(2) The method of producing a III nitride semiconductor light-emitting device, according to (1) above, wherein an Al content y of the electron blocking layer satisfies $0.5 \le y \le 1$.

(3) The method of producing a III nitride semiconductor light-emitting device, according to (1) or (2) above, wherein a center wavelength of light emitted from the light emitting layer is 300 nm or less.

(4) A III nitride semiconductor light-emitting device produced by the method according to any one of (1) to (3) above.

Advantageous Effect

A III nitride semiconductor light-emitting device with both high light output power and long lifetime can be produced by, in a p-type semiconductor layer, providing a p-type contact layer having an Al content x satisfying $0 \le x \le 0.1$ directly on an electron blocking layer, forming the electron blocking layer using a carrier gas containing hydrogen as a main component, and forming the p-type contact layer using a carrier gas containing nitrogen as a main component.

Figure 1:
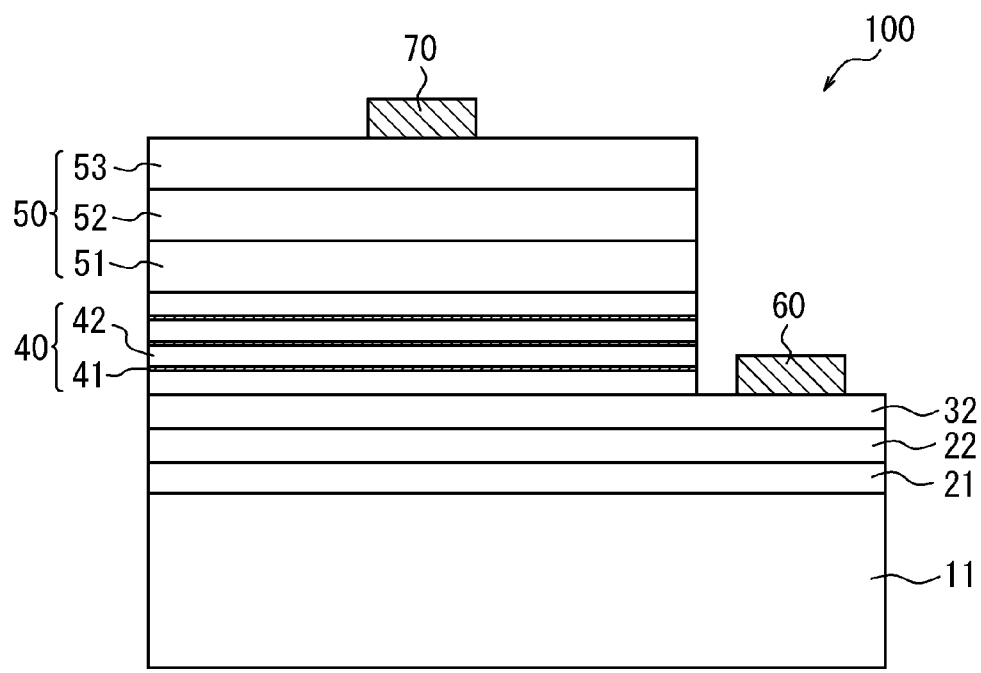
FIG. 1 is a schematic cross-sectional view of a III nitride semiconductor light-emitting device of Conventional Example 1.

DETAILED DESCRIPTION (Method of Producing III Nitride Semiconductor Light-Emitting Device)

Embodiments will now be described with reference to the drawings. In principle, like components are denoted by the same reference numerals, and the description of those components will not be repeated. A sapphire substrate and layers in each diagram are exaggerated for the sake of explanation, so that the aspect ratio does not conform to the actual ratio.

A method of producing a III nitride semiconductor light-emitting device according to one of the disclosed embodiments is a method of producing a III nitride semiconductor light-emitting device having an n-type semiconductor layer, a light emitting layer having a quantum well structure in which a well layer is made of $Al_aGa_{1-a}N$ (0.3≤a≤0.8) and a barrier layer is made of $Al_bGa_{1-b}N$ (0.4≤b≤0.95); and a p-type semiconductor layer in this order. Here, it is important that the above p-type semiconductor layer is formed by the steps including: an electron blocking layer formation step for forming an electron blocking layer made of $Al_yGa_{1-y}N$ (b<y≤1) on the light emitting layer; and a p-type contact formation step for forming a p-type contact layer which is $Al_xGa_{1-x}N$ (0≤x≤0.1) directly on the electron blocking layer, and the electron blocker formation step is performed using a carrier gas containing hydrogen as a main component and the p-type contact formation step is performed using a carrier gas containing nitrogen as a main component.

In attempts to achieve both high light output power and long lifetime, the inventors noted a p-type laminate 50 in a light-emitting device 100 of Conventional Example 1 illustrated in FIG. 1. An electron blocking layer 51, a p-type cladding layer 52, and a p-type contact layer 53 composing the p-type laminate 50 are typically formed by supplying to a chamber, a source gas of, for example, trimethylgallium (TMG) as a carrier gas containing hydrogen as a main component. In order to ascertain the function and effect of the p-type cladding layer 52, the inventors fabricated a light-emitting device by forming the p-type contact layer 53 directly on the electron blocking layer 51, using a carrier gas containing hydrogen as a main component without forming the p-type cladding layer 52 in attempt to examine the emission characteristics of the element. However, the element failed to emit light (Comparative Example 1 in EXAMPLES). Similarly, the element failed to emit light in the case where the electron blocking layer 51 was formed using a carrier gas containing nitrogen as a main component without forming the p-type cladding layer 52 (Comparative Example 4 in EXAMPLES) and also in the case where both the electron blocking layer 51 and the p-type contact layer 53 were formed using a carrier gas containing nitrogen as a main component (Comparative Example 5 in EXAMPLES). These results once made the inventors believe that the p-type cladding layer 52 was necessary.

Accordingly, the inventors experimented with replacing the p-type cladding layer 52 and formed the electron blocking layer 51 and the p-type cladding layer 52 using a carrier gas containing nitrogen instead of hydrogen as a main component (Comparative Example 2 in EXAMPLES). However, the resulting element failed to emit light. Following this, the electron blocking layer 51, the p-type cladding layer 52, and the p-type contact layer 53 were all formed using a carrier gas containing nitrogen as a main component. Also in this case, the element failed to emit light (Comparative Example 3 in EXAMPLES). With this being the case, the electron blocking layer 51 and the p-type cladding layer 52 were formed using a carrier gas containing hydrogen as a main component, and only the p-type contact layer 53 was formed using a carrier gas containing nitrogen as a main component. The resulting element emitted light with an output comparable to that of the device in PTL 1. However, the lifetime of the resulting element was evaluated and found to be significantly lower than in PTL 1 (Comparative Example 6 in EXAMPLES).

Thereupon, the inventors removed the p-type cladding layer 52 again, and formed the p-type contact layer 53 using a gas containing nitrogen as a main component as a carrier gas. The resulting element emitted light with an output comparable to that of the element in PTL 1, and the lifetime of the resulting device had significantly improved. These discoveries led to this disclosure.

As described above, the manner of forming a p-type semiconductor layer 50 provided on a light emitting layer 40 is significant in this disclosure, which does not limit the specific structure of a sapphire substrate 11, an AlN layer 21, an undoped layer 22, an n-type semiconductor layer 32, and the light emitting layer 40 that are provided under the p-type semiconductor layer 50.

Figure 2:
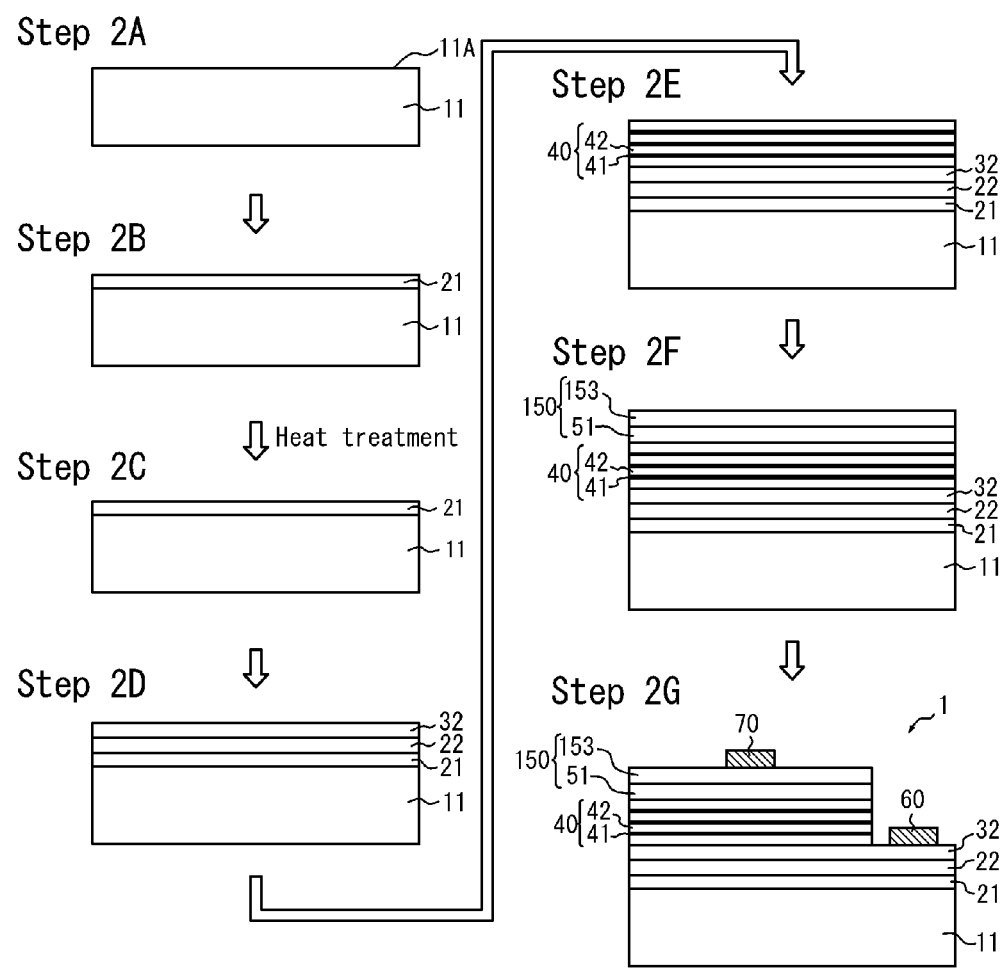
FIG. 2 illustrates steps in a method of producing a III nitride semiconductor light-emitting device according to a preferred embodiment of the disclosed embodiments.

Steps 2A to 2G of FIG. 2 illustrate steps in a method of producing a III nitride semiconductor light-emitting device according to a preferred embodiment of the disclosed embodiments. First, as depicted in Step 2A, a sapphire substrate 11 is prepared. A main surface 11A of the sapphire substrate 11 may optionally have an off-angle. The crystallographic orientation in the inclination direction may be either in the m-axis direction or in the a-axis direction; for example, the C-plane may be inclined at an off-angle of 0.5° as described in Japanese Patent Application No. 2014-224637.

Next, as depicted in Step 2B, the AlN layer 21 is epitaxially grown on the sapphire substrate 11. The AlN layer 21 can be formed by a known thin film deposition technique, for example, by metalorganic chemical vapor deposition (MOCVD), molecular beam epitaxy (MBE), or sputtering.

For the Al source for the AlN layer 21, trimethylaluminum (TMA) can be used. Meanwhile, for the N source, ammonia ($NH_3$) gas can be used. Those source gases are used with hydrogen gas as a carrier gas to form the AlN layer 21.

Note that the growth temperature of the AlN layer 21 is preferably 1270° C. or more and 1350° C. or less, more preferably 1290° C. or more and 1330° C. or less. With this temperature range, the crystallinity of the AlN layer 21 can be improved after the subsequent heat treatment. Further, the growth pressure in the chamber can be, for example, 5 Torr to 20 Torr, more preferably 8 Torr to 15 Torr.

The molar ratio of a group V element gas such as $NH_3$ gas to a group III element gas such as TMA gas, calculated based on the growth gas flow rate of the group V element gas and the group III element gas (hereinafter referred to as V/III ratio) can be, for example, 130 or more and 190 or less. More preferably, the V/III ratio is 140 or more and 180 or less. Note that since the growth temperature and the growth pressure determine the optimum V/III ratio, the growth gas flow rate is preferably determined appropriately.

Subsequently, the AlN layer 21 on the sapphire substrate 11, obtained as described above is preferably subjected to a heat treatment at a temperature higher than the growth temperature of the AlN layer 21. The heat treatment process can be performed using a known heat treatment furnace. Performing the heat treatment makes the half width of the X-ray rocking curve of the (10-12) plane of the AlN layer 21 be 400 s or less; thus, high crystallinity can be achieved (Step 2C).

After that, as depicted in Step 2D, a layered structure having the undoped layer 22 and the n-type semiconductor layer 32 in this order can be formed.

Next, as depicted in Step 2E, the light emitting layer 40 is formed. The light emitting layer 40 contains at least Al, and can be formed from, for example, an $Al_aGa_{1-a}N$ material (0<a≤1). Here, the Al content is suitably set so that light having the desired wavelength is emitted. When the Al content a is 0.35 or more, the center wavelength of the light emitted from the light emitting layer 40 is 300 nm or less. In this case, the III nitride semiconductor light-emitting device 1 to be ultimately obtained is a DUV-LED.

This light emitting layer 40 can have a multiple quantum well (MQW) structure in which well layers 41 and barrier layers 42 formed from AlGaN having different Al contents are repeatedly formed. The Al content a of the well layers 41 is, for example, 0.35 to 0.8. The Al content b of the barrier layers 42 is higher than the Al content a of the well layers 41, for example, 0.4 to 0.95. Further, the number of repetitions of the well layers 41 and barrier layers 42 is, for example, 1 to 10. The thickness of the well layers 41 is 0.5 nm to 5 nm, whereas the thickness of the barrier layers 42 is 3 nm to 30 nm.

When the light emitting layer 40 is formed from an AlGaN material, for the Al source, TMA can be used; for the Ga source, trimethylgallium (TMG); and for the N source, $NH_3$ gas. Those source gases are supplied into a chamber using hydrogen gas as a carrier gas, thereby forming the light emitting layer 40. When the light emitting layer 40 has a MQW structure, the ratio between the flow rate of the Al source and the flow rate of the Ga source is suitably changed, thereby forming the light emitting layer 40 having a MQW structure.

When the light emitting layer 40 is formed from an $Al_aGa_{1-a}N$ material ($0.3 \leq a \leq 0.8$), the growth temperature of the AlGaN material is preferably 1000° C. or more and 1400° C. or less, more preferably 1050° C. or more and 1350° C. or less.

The molar ratio of a group V element gas such as $NH_3$ gas to a group III element gas such as TMA gas, calculated based on the growth gas flow rate of the group V element gas and the group III element gas (hereinafter referred to as V/III ratio) can be, for example, 100 or more and 100000 or less. More preferably, the V/III ratio is 300 or more and 30000 or less. Since the growth temperature and the growth pressure determine the optimum V/III ratio, the growth gas flow rate is preferably determined appropriately as in the case of the AlN layer 21.

Subsequently, as depicted in Step 2F, a p-type semiconductor layer 150 is formed on the light emitting layer 40. As described above, the p-type semiconductor layer 150 does not include a layer corresponding to the p-type cladding layer 52 illustrated in FIG. 1, and has the electron blocking layer 51 and a p-type contact layer 153 provided directly on the electron blocking layer 51.

The electron blocking layer 51 is typically a layer provided between the light emitting layer and the p-type cladding layer to stop electrons and inject the electrons into the light emitting layer 40 (well layers 41 in the case of the MQW) thereby improving the electron injection efficiency. In particular, when the Al content of the light emitting layer 40 is high, the hole concentration of the p-type semiconductor layer is low, which makes it difficult to inject holes into the light emitting layer 40, and the electrons would partly flow to the p-type semiconductor layer side. However, the provision of the electron blocking layer 51 allows such a flow of electrons to be avoided. Note that the "electron blocking layer" herein means a layer having an Al content y that is higher than the Al content b of the barrier layers 42 constituting part of the light emitting layer 40, and having a large band gap. On the other hand, the "cladding layer" herein refers to a layer having an Al content more than 0.1 lower than that of the electron blocking layer and more than 0.1 higher than that of the p-type contact layer. Note that when p-type AlGaN used for a center wavelength of 300 nm or less has a higher Al content, the current more hardly flows. Accordingly, a conventional cladding layer often has an Al content equal to or lower than that of conventional barrier layers. Therefore, the disclosed electron blocking layer and a cladding layer of a conventional technique can also be distinguished based on the Al content of barrier layers.

The electron blocking layer 51 can be formed from, for example, a p-type $Al_yGa_{1-y}N$ material ($b<y \leq 1$). Although depending on the Al content of the barrier layers 42, the Al content of the electron blocking layer 51 is preferably, for example, 0.5 or more and 1.0 or less. Such a structure can increase the injection efficiency of electrons into the well layers 41. Further, the thickness of the electron blocking layer 51 is, for example, 6 nm to 60 nm. When the thickness of the electron blocking layer 51 is either smaller than 6 nm or larger than 60 nm, the output is significantly reduced. Note that the thickness of the electron blocking layer 51 is preferably larger than that of the barrier layers.

A dopant used to impart p-type conductivity to the electron blocking layer 51 may be magnesium (Mg) or zinc (Zn). For the Mg source, bis(cyclopentadienyl)magnesium ($CP_2Mg$) can be used, and for the Zn source, zinc chloride ($ZnCl_2$) can be used.

When the electron blocking layer 51 is formed from a p-type $Al_yGa_{1-y}N$ material ($b<y \leq 1$), the electron blocking layer 51 can be formed by supplying TMA, TMG, and $NH_3$ gas, which are source gases, and for example $CP_2Mg$, which is an impurity gas, into a chamber using, as a carrier gas, a gas containing hydrogen as a main component. Note that when a gas containing nitrogen as a main component is used from the beginning of the formation of the electron blocking layer 51, the device fails to emit light. Here, the term "carrier gas containing hydrogen as a main component" means a carrier gas in which the ratio of the volume of hydrogen to the total volume of the carrier gas is 60% or more. More preferably, the volume ratio is 85% or more. A pure hydrogen based gas commercially available for semiconductor fabrication may be employed for the above carrier gas.

When the electron blocking layer 51 is formed from an $Al_yGa_{1-y}N$ material ($b<y \leq 1$), the growth temperature of the $Al_yGa_{1-y}N$ material is preferably 1000° C. or more and 1400° C. or less, more preferably, 1050° C. or more and 1350° C. or less. The growth pressure in the chamber can be, for example, 10 Torr to 760 Torr. More preferably, the growth pressure is 20 Torr to 380 Torr.

The molar ratio of a group V element gas such as $NH_3$ gas to a group III element gas such as TMA gas, calculated based on the growth gas flow rate of the group V element gas and the group III element gas (hereinafter referred to as V/III ratio) can be, for example, 100 or more and 100000 or less. More preferably, the V/III ratio is 300 or more and 30000 or less. Since the growth temperature and the growth pressure determine the optimum V/III ratio, the growth gas flow rate is preferably determined appropriately as in the case of the AlN layer 21.

Subsequently, the p-type contact layer 153 is formed on the electron blocking layer 51. The p-type contact layer 153 is formed using a carrier gas containing nitrogen as a main component. Here, the term "carrier gas containing nitrogen as a main component" means a carrier gas in which the ratio of the volume of nitrogen to the total volume of the carrier gas is 60% or more. More preferably, the volume ratio is 85% or more. A pure nitrogen based gas commercially available for semiconductor fabrication may be employed for the above carrier gas.

The p-type contact layer 153 is formed from a p-type $Al_xGa_{1-x}N$ material. The p-type contact layer 153 is a layer for reducing the contact resistance between a p-type electrode 70 to be formed thereon and the electron blocking layer 51. In this regard, the Al content x of the p-type contact layer 153 should satisfy $0 \leq x \leq 0.1$. This can sufficiently reduce the contact resistance between the electron blocking layer 51 and the p-type electrode 70 formed on the p-type contact layer 153. In particular, the Al content x preferably satisfies x=0.

A dopant used to impart p-type conductivity to the p-type contact layer 153 may be magnesium (Mg) or zinc (Zn) as with the electron blocking layer 51. Similarly, for the Mg source, bis(cyclopentadienyl)magnesium ($CP_2Mg$) can be used, and for the Zn source, zinc chloride ($ZnCl_2$) can be used.

An example of switching gases according to this embodiment will be described below. After forming the electron blocking layer 51, upon once switching the flow of a metalorganic gas (a group III element gas and a dopant source gas) from into a chamber to a vent, the carrier gas flown into the chamber is switched from hydrogen to nitrogen. After the carrier gas is completely switched to nitrogen, a metalorganic gas is supplied into the chamber to form the p-type contact layer 153 on the electron blocking layer 51. Changing the carrier gas without switching the flow to the vent would cause abnormal growth due to a rapid change of the gas flow. Note that the group V element gas is kept being flown into the chamber to prevent the group V element from being detached from the electron blocking layer. Further, once switching the flow of the metalorganic gas from into the chamber to the vent as described above interrupts the crystal growth on the electron blocking layer 51. While the atmosphere on the electron blocking layer 51 is switched from hydrogen to nitrogen to achieve a complete nitrogen atmosphere, the electron blocking layer 51 is heated while being exposed to the carrier gas and the group V element gas, with the hydrogen partial pressure being reduced. This may benefit the improvement in the carrier density in the vicinity of the interface between the electron blocking layer 51 and the p-type contact layer 153. After the complete nitrogen atmosphere is achieved, the metalorganic gas is supplied into the chamber after an interval of one second or more in a preferred aspect.

The growth temperature of the p-type contact layer 153 is preferably 800° C. or more and 1400° C. or less, more preferably 900° C. or more and 1300° C. or less. Further, the growth pressure in the chamber can be, for example, 10 Torr to 760 Torr, more preferably 20 Torr to 600 Torr.

The molar ratio of a group V element gas such as $NH_3$ gas to a group III element gas such as TMA gas, calculated based on the growth gas flow rate of the group V element gas and the group III element gas (hereinafter referred to as V/III ratio) can be, for example, 100 or more and 100000 or less. More preferably, the V/III ratio is 300 or more and 30000 or less. Since the growth temperature and the growth pressure determine the optimum V/III ratio, the growth gas flow rate is preferably determined appropriately as in the case of the AlN layer 21.

Lastly, as illustrated in Step 2G, after the light emitting layer 40 and the p-type semiconductor layer 150 are partially removed by etching or the like; the n-type electrode 60 is formed on the exposed n-type semiconductor layer 32, and the p-type electrode 70 is formed on the p-type contact layer 153. Thus, the nitride semiconductor light-emitting device 1 in accordance with a preferred embodiment can be fabricated.

Here, the n-side electrode 60 can be formed, for example, as a metal composite film having a Ti-containing film and an Al-containing film formed on the Ti-containing film. The thickness, shape, and size of each of these films in the n-side electrode can be appropriately selected in accordance with the shape and size of the light-emitting device. Further, the p-side electrode 70 can be formed, for example, as a metal composite film having a Ni-containing film and an Au-containing film formed on the Ni-containing film. The thickness, shape, and size of these films in the p-side electrode can be appropriately selected in accordance with the shape and size of the light-emitting device.

(III Nitride Semiconductor Light-Emitting Device)

A III nitride semiconductor light-emitting device according to one of the disclosed embodiments is produced by the above-described method of producing a III nitride semiconductor light-emitting device. The resulting III nitride semiconductor light-emitting device 1 has both high light output power and long lifetime.

Thus, a III nitride semiconductor light-emitting device having both high light output power and long lifetime can be produced.

EXAMPLES

Example 1

The disclosed method of producing a III nitride semiconductor emitting device will be described in more detail below. However, this disclosure is not limited to the following example. A III nitride semiconductor light-emitting device was fabricated in accordance with the process illustrated in Steps 2A to 2G of FIG. 2. First, a sapphire substrate (diameter: 2 in, thickness: 430 µm, plane direction: (0001), off-angle q in m-axis direction: 0.5°, terrace width: 100 nm, step height: 0.20 nm) was prepared (Step 2A). Next, an AlN layer having a center thickness of 0.60 µm (average thickness: 0.61 µm) was grown by MOCVD on the above sapphire substrate to obtain an AlN template substrate (Step 2B). On that occasion, the growth temperature of the AlN layer was 1300° C., the growth pressure in the chamber was 10 Torr, and the growth gas flow rate of ammonia gas and TMA gas was set so that the V/III ratio was 163. The flow rate of the group V element gas ($NH_3$) was 200 sccm, and the flow rate of the group III element gas (TMA) was 53 sccm. Note that for the thickness of the AlN layer, the thicknesses of total 25 portions distributed at regular intervals, including the center of the wafer plane were measured using an interference thickness measurement system (Nanospec M6100A manufactured by Nanometrics Incorporated).

Next, the above AlN template substrate was introduced into a heat treatment furnace. After the pressure of the furnace was reduced to 10 Pa, the furnace was purged with nitrogen gas to achieve a nitrogen gas atmosphere in the furnace, followed by raising the temperature inside the furnace, thus performing heat treatment on the AlN template substrate (Step 2C). The heat treatment was performed at a heating temperature of 1650° C. for a heating time of four hours.

Subsequently, an undoped $Al_{0.7}Ga_{0.3}N$ layer made of $Al_{0.7}Ga_{0.3}N$ with a thickness of 1 µm was formed as an undoped layer by MOCVD. Next, on the undoped layer, an n-type $Al_{0.62}Ga_{0.38}N$ layer made of $Al_{0.62}Ga_{0.38}N$, doped with Si with a thickness of 2 µm was formed as an n-type semiconductor layer (Step 2D). Note that according to a result of SIMS analysis, the Si concentration of the n-type semiconductor layer was $1.0 \times 10^{19}$ atoms/$cm^3$.

Next, on the n-type semiconductor layer, well layers made of $Al_{0.45}Ga_{0.55}N$ with a thickness of 3 nm and barrier layers made of $Al_{0.65}Ga_{0.35}N$ with a thickness of 7 nm were alternately and repeatedly stacked thereby forming a light emitting layer having 3.5 pairs of the layers (Step 2E). Of 3.5 pairs, 0.5 pair indicates that the top and bottom layers in the light emitting layer were barrier layers.

On the light emitting layer, an electron blocking layer made of $Al_{0.68}Ga_{0.32}N$, doped with Mg with a thickness of 40 nm was then formed using hydrogen gas as a carrier gas. Subsequently, a p-type contact layer made of GaN, doped with Mg with a thickness of 180 nm was formed using nitrogen gas as a carrier gas. On that occasion, the growth pressure inside the chamber was 300 mbar. Further, the flow rates of the nitrogen gas used as a carrier gas, $NH_3$ gas, TMG, and $Cp_2Mg$ were 30 slm, 30 slm, 150 sccm and 1000 sccm, respectively. Note that the flow rate of the TMG gas was reduced to increase the probability of the presence of Mg in a region of the p-type contact layer with a thickness of 30 nm of the total thickness of 180 nm, the region being in contact with the electrode, and the growth rate was reduced, thereby obtaining a layer having a high Mg concentration. Lastly, a mask was formed on the p-type contact layer, and mesa etching was performed by dry etching to expose the n-type semiconductor layer. Next, a p-type electrode made of Ni/Au was formed on the p-type contact layer, and an n-type electrode made of Ti/Al was formed on the exposed n-type semiconductor layer. Note that the p-type electrode had Ni having a thickness of 50 angstrom and Au having a thickness of 1500 angstrom. Further, the n-type electrode had Ti having a thickness of 200 angstrom and Al having a thickness of 1500 angstrom. Lastly, contact annealing (RTA) was performed at 550° C. to form an electrode. Thus, a III nitride semiconductor light-emitting device in accordance with Example 1 was fabricated.

Conventional Example 1

A III nitride semiconductor light-emitting device was fabricated in a similar manner to Example 1. For this device, a p-type cladding layer (thickness: 50 nm) was formed on an electron blocking layer, and a p-type contact layer was formed on the p-type cladding layer. Further, the p-type contact layer was formed using hydrogen gas as a carrier gas. All the other conditions were the same as those in Example 1.

Comparative Example 1

A III nitride semiconductor light-emitting device was fabricated in a similar manner to Example 1. For this device, a p-type contact layer was formed using hydrogen gas as a carrier gas. All the other conditions were the same as those in Example 1.

Comparative Example 2

A III nitride semiconductor light-emitting device was fabricated in a similar manner to Conventional Example 1. For this device, an electron blocking layer was formed using nitrogen gas as a carrier gas. All the other conditions were the same as those in Conventional Example 1.

Comparative Example 3

A III nitride semiconductor light-emitting device was fabricated in a similar manner to Conventional Example 1. For this device, both an electron blocking layer and a p-type contact layer were formed using nitrogen gas as a carrier gas. All the other conditions were the same as those in Conventional Example 1.

Comparative Example 4

A III nitride semiconductor light-emitting device was fabricated in a similar manner to Example 1. For this device, an electron blocking layer was formed using nitrogen gas as a carrier gas, and a p-type contact layer was formed using hydrogen as a carrier gas. All the other conditions were the same as those in Example 1.

Comparative Example 5

A III nitride semiconductor light-emitting device was fabricated in a similar manner to Example 1. For this device, an electron blocking layer was formed using nitrogen gas as a carrier gas. All the other conditions were the same as those in Example 1.

Comparative Example 6

A III nitride semiconductor light-emitting device was fabricated in a similar manner to Example 1. For this device, a p-type cladding layer (thickness: 50 nm) was formed on an electron blocking layer, and a p-type contact layer was formed on the p-type cladding layer. All the other conditions were the same as those in Example 1.

<Evaluation of Light Emission Characteristics and Forward Voltage>

The light output power Po (mW) and forward voltage Vf of the resulting flip-chip III nitride semiconductor light-emitting device fabricated in accordance with Example 1 were measured at a current of 20 mA and were 2.9 mW and 7.8 V, respectively. Here, the light output power Po (mW) was measured using an integrating sphere. Similarly, the light output power and forward voltage were measured in Conventional Example 1 and were 3.1 mW and 7.7 V, respectively. On the other hand, the devices in Comparative Examples 1 to 5 failed to emit light. The light output power and forward voltage were measured in Comparative Example 6 and were 3.0 mW and 9.1 V, respectively. As demonstrated above, in Example 1, a light output power and a forward voltage that were comparative to those in Conventional Example 1 were achieved. On the other hand, in Comparative Example 6, the light output power was comparative to that in Conventional Example 1; however, the forward voltage was significantly high. The results are given in Table 1.

TABLE 1

| | Electron blocking layer | | P-type cladding layer | | | P-type contact layer | | Light output power $P_o$ (mW) | Forward voltage $V_f$ (V) | Residual output |
|---|---|---|---|---|---|---|---|---|---|---|
| | Carrier gas | Al content | Presence | Carrier gas | Al content | Carrier gas | Al content | | | |
| Conventional Example 1 | $H_2$ | 0.68 | yes | $H_2$ | 0.35 | $H_2$ | 0 | 3.1 | 7.7 | 89% |
| Comparative Example 1 | $H_2$ | 0.68 | no | — | — | $H_2$ | 0 | No light emission | — | — |

TABLE 1-continued

| | Electron blocking layer | | P-type cladding layer | | P-type contact layer | | Light output power $P_o$ (mW) | Forward voltage $V_f$ (V) | Residual output |
|---|---|---|---|---|---|---|---|---|---|
| | Carrier gas | Al content | Presence | Carrier gas | Al content | Carrier gas | Al content | | | |
| Comparative Example 2 | $N_2$ | 0.68 | yes | $N_2$ | 0.35 | $H_2$ | 0 | No light emission | — | — |
| Comparative Example 3 | $N_2$ | 0.68 | yes | $N_2$ | 0.35 | $N_2$ | 0 | No light emission | — | — |
| Comparative Example 4 | $N_2$ | 0.68 | no | — | — | $H_2$ | 0 | No light emission | — | — |
| Comparative Example 5 | $N_2$ | 0.68 | no | — | — | $N_2$ | 0 | No light emission | — | — |
| Comparative Example 6 | $H_2$ | 0.68 | yes | $H_2$ | 0.35 | $N_2$ | 0 | 3.0 | 9.1 | 82% |
| Example 1 | $H_2$ | 0.68 | no | — | — | $N_2$ | 0 | 2.9 | 7.8 | 94% |

<Evaluation of Light Emission Lifetime>

In order to determine the lifetime characteristics, the residual output of the III nitride semiconductor light-emitting device of Example 1 having been energized for six hours (output after 6 h energization/initial light output) was measured and was 94% to the initial output. Similarly, the residual output was measured after a lapse of six hours in Conventional Example 1 and Comparative Example 6, and the respective residual outputs were 89% (Conventional Example 1) and 82% (Comparative Example 6). As demonstrated above, the light emission lifetime in Example 1 was significantly improved as compared to Conventional Example 1 and Comparative Examples. The results are given in Table 1.

As demonstrated above, in Example 1, the lifetime was significantly improved with sufficient light output power and forward voltage being kept.

INDUSTRIAL APPLICABILITY

A III nitride semiconductor light-emitting device with both high light output power and long lifetime can be produced by, in a p-type semiconductor layer, providing a p-type contact layer having an Al content x satisfying 0≤x≤0.1 directly on an electron blocking layer, forming the electron blocking layer using a carrier gas containing hydrogen as a main component, and forming the p-type contact layer using a carrier gas containing nitrogen as a main component. This technique is useful in the photoelectric transducer manufacturing industry

REFERENCE SIGNS LIST 1, 100: III nitride semiconductor light-emitting device
11: Sapphire substrate
11A: Main surface of substrate
21: AlN layer
22: Undoped layer
32: N-type semiconductor layer
40: Light emitting layer
41: Well layer
42: Barrier layer
50, 150: P-type semiconductor layer
51: Electron blocking layer
52: P-type cladding layer
53, 153: P-type contact layer
60: N-type electrode
70: P-type electrode

The invention claimed is:

1. A method of producing a III nitride semiconductor light-emitting device including an n-type semiconductor layer, a light emitting layer having a quantum well structure in which a well layer is formed from $Al_aGa_{1-a}N$, where a satisfies 0.3≤a≤0.8, and a barrier layer is formed from $Al_bGa_{1-b}N$, where b satisfies 0.4≤b≤0.95, and a p-type semiconductor layer in this order, wherein the p-type semiconductor layer is formed by the steps comprising:

(i) an electron blocking layer formation step for forming an electron blocking layer made of $Al_yGa_{1-y}N$, where y satisfies b<y≤1, on the light emitting layer; and (ii) a p-type contact formation step for forming a p-type contact layer which is $Al_xGa_{1-x}N$, where x satisfies 0≤x≤0.1, directly on the electron blocking layer, and wherein (i) the electron blocking layer formation step is performed using a carrier gas consisting of hydrogen, (ii) the p-type contact formation step is performed using a carrier gas consisting of nitrogen, the steps further comprise a switching step for switching carrier gas from the hydrogen to the nitrogen between (i) the electron blocking layer formation step and (ii) the p-type contact formation step, and the electron blocking layer is heated while being exposed to the carrier gas and a group V element gas, with the hydrogen partial pressure being reduced in the switching step.

2. The method of producing a III nitride semiconductor light-emitting device, according to claim 1, wherein an Al content y of the electron blocking layer satisfies 0.5≤y≤1.

3. The method of producing a III nitride semiconductor light-emitting device, according to claim 1, wherein a center wavelength of light emitted from the light emitting layer is 300 nm or less.

* * * * *

UNITED STATES PATENT AND TRADEMARK OFFICE
CERTIFICATE OF CORRECTION

PATENT NO. : 10,062,806 B2
APPLICATION NO. : 15/533138
DATED : August 28, 2018
INVENTOR(S) : Takehiko Fujita et al.

Page 1 of 1

It is certified that error appears in the above-identified patent and that said Letters Patent is hereby corrected as shown below:

In the Specification

Column 2, Line 11, please delete "$Al_yGa_{1-a}N$" and insert --$Al_yGa_{1-y}N$--.

Signed and Sealed this
Eighth Day of January, 2019

Andrei Iancu
*Director of the United States Patent and Trademark Office*